(12) United States Patent
Yotsuji

(10) Patent No.: US 9,722,553 B2
(45) Date of Patent: Aug. 1, 2017

(54) HIGH-FREQUENCY AMPLIFIER CIRCUIT

(71) Applicant: LAPIS Semiconductor Co., Ltd., Yokohama (JP)

(72) Inventor: Tetsuaki Yotsuji, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/838,356

(22) Filed: Aug. 27, 2015

(65) Prior Publication Data

US 2016/0065135 A1 Mar. 3, 2016

(30) Foreign Application Priority Data

Aug. 28, 2014 (JP) .................................. 2014-174235

(51) Int. Cl.
| | |
|---|---|
| *H03F 3/04* | (2006.01) |
| *H03F 3/193* | (2006.01) |
| *H03F 1/02* | (2006.01) |
| *H03F 1/22* | (2006.01) |
| *H03F 3/21* | (2006.01) |
| *H03F 3/72* | (2006.01) |

(52) U.S. Cl.
CPC .......... *H03F 3/193* (2013.01); *H03F 1/0261* (2013.01); *H03F 1/0277* (2013.01); *H03F 1/223* (2013.01); *H03F 3/211* (2013.01); *H03F 3/72* (2013.01); *H03F 2200/18* (2013.01); *H03F 2200/451* (2013.01); *H03F 2203/7236* (2013.01)

(58) Field of Classification Search
CPC ..................................................... H03F 1/301
USPC ......... 330/296, 297, 311, 305, 288, 98, 133, 330/150
See application file for complete search history.

(56) References Cited

FOREIGN PATENT DOCUMENTS

JP        2003-243938 A      8/2003

*Primary Examiner* — Khanh V Nguyen
*Assistant Examiner* — Khiem Nguyen
(74) *Attorney, Agent, or Firm* — Rabin & Berdo, P.C.

(57) ABSTRACT

A high-frequency amplifier circuit comprising a first and a second amplification units connected in cascade structure and so on. The first amplification unit includes an FET of a first conductivity type having a source terminal supplied with a first potential, and a first inductor connected to an intermediate potential line, and the second amplification unit includes an FET of a second conductivity type having a source terminal supplied with a second potential, and a second inductor connected to the intermediate potential line. The intermediate potential line is supplied with an intermediate potential between the first and second potentials. The first and second amplification units are supplied with bias voltages by a first and a second bias units, respectively. An operating current for the second bias unit is controlled on the basis of the intermediate potential.

20 Claims, 11 Drawing Sheets

HIGH-FREQUENCY AMPLIFIER CIRCUIT

BACKGROUND OF THE INVENTION

1. Field of the Invention

The present invention relates to a high-frequency amplifier circuit in a receiver used for radio communication and so on.

2. Description of the Related Art

In a receiver used for radio communication and so on, a lower power consumption in a high-frequency amplifier circuit needs to be achieved in order to extend the life of a battery. As such a high-frequency amplifier circuit, a two-stage amplifier circuit in which two transistors are connected to each other in cascade has been proposed (Japanese Patent Application Kokai No. 2003-243938, for example). In the two-stage amplifier circuit, a current flowing through the transistor in the second stage is reused in the first stage. Thus, a power consumption in the circuit as a whole can be kept low.

In such a receiver, a signal input from an antenna is amplified by a high-frequency amplifier circuit and supplied to a frequency conversion circuit. The frequency conversion circuit mixes the signal supplied by the high-frequency amplifier circuit with a local signal supplied by a local oscillation circuit for conversion into an intermediate frequency. The frequency conversion circuit supplies the obtained intermediate-frequency signal to a demodulation processing unit. At this time, a phenomenon in which part of the local signal applied to the frequency conversion circuit by the local oscillation circuit flows not in a direction toward the demodulation processing unit but in a direction heading toward the antenna from the high-frequency amplifier circuit, i.e., in a reverse direction, occurs. If such a signal flowing in the reverse direction reaches the antenna, unwanted radiation occurs, resulting in a cause of electromagnetic interference. Thus, such a signal needs to be blocked in the high-frequency amplifier circuit as much as possible.

In order to improve a characteristic of blocking such a signal flowing in the reverse direction (reverse isolation), it is preferable that parasitic capacitance from an output to an input is made small by connecting a plurality of transistors using connection structure such as cascade structure. However, if the number of transistors connected in cascade structure and so on is increased, a power-supply potential needs to be set high, resulting in a higher power consumption.

SUMMARY OF THE INVENTION

The present invention has been made in order to solve the above-described problem. The present invention provides a high-frequency amplifier circuit for amplifying an input high-frequency signal and outputting the amplified high-frequency signal, comprising: a first amplification unit which receives a high-frequency signal via its input terminal and amplifies the high-frequency signal so as to generate an high-frequency amplified signal; a second amplification unit which further amplifies the high-frequency amplified signal to generate an output signal and outputs the output signal via its output terminal; a first bias unit which supplies a bias voltage to the first amplification unit; a second bias unit which supplies a bias voltage to the second amplification unit; an intermediate potential line which supplies an intermediate potential between a first potential and a second potential to the first amplification unit and the second amplification unit; a current generating unit which generates an operating current for the first bias unit; and a current control unit which is connected to the intermediate potential line and which controls an operating current for the second bias unit on the basis of the intermediate potential, wherein the first amplification unit includes: a first field effect transistor (FET) of a first conductivity type, having a source terminal supplied with the first potential; and a first inductor connected to the intermediate potential line, and the second amplification unit includes: a second FET of a second conductivity type opposite to the first conductivity type, having a source terminal supplied with the second potential; and a second inductor connected to the intermediate potential line.

Also, the present invention provides a high-frequency amplifier circuit for amplifying an input high-frequency signal and outputting the amplified high-frequency signal, comprising: a first amplification unit which receives a high-frequency signal via its input terminal and amplifies the high-frequency signal so as to generate a high-frequency amplified signal; a second amplification unit which further amplifies the high-frequency amplified signal to generate an output signal and outputs the output signal via its output terminal; a first bias unit which supplies a bias voltage to the first amplification unit; a second bias unit which supplies a bias voltage to the second amplification unit; an intermediate potential line which supplies an intermediate potential between a first potential and a second potential to the first amplification unit and the second amplification unit; a current control unit which is connected to the intermediate potential line and which controls an operating current for the first bias unit on the basis of the intermediate potential; and a current generating unit which generates an operating current for the second bias unit, wherein the first amplification unit includes: a first field effect transistor (FET) of a first conductivity type, having a source terminal supplied with the first potential; and a first inductor connected to the intermediate potential line, and the second amplification unit includes: a second FET of a second conductivity type opposite to the first conductivity type, having a source terminal supplied with the second potential; and a second inductor connected to the intermediate potential line.

According to the present invention, the high-frequency amplifier circuit capable of improving the characteristic of blocking a signal flowing in the reverse direction (input direction) and lowering a power-supply voltage to achieve a lower power consumption is obtained.

DETAILED DESCRIPTION OF THE INVENTION

Embodiments of the present invention will be described below in detail.

First Embodiment

Figure 1:
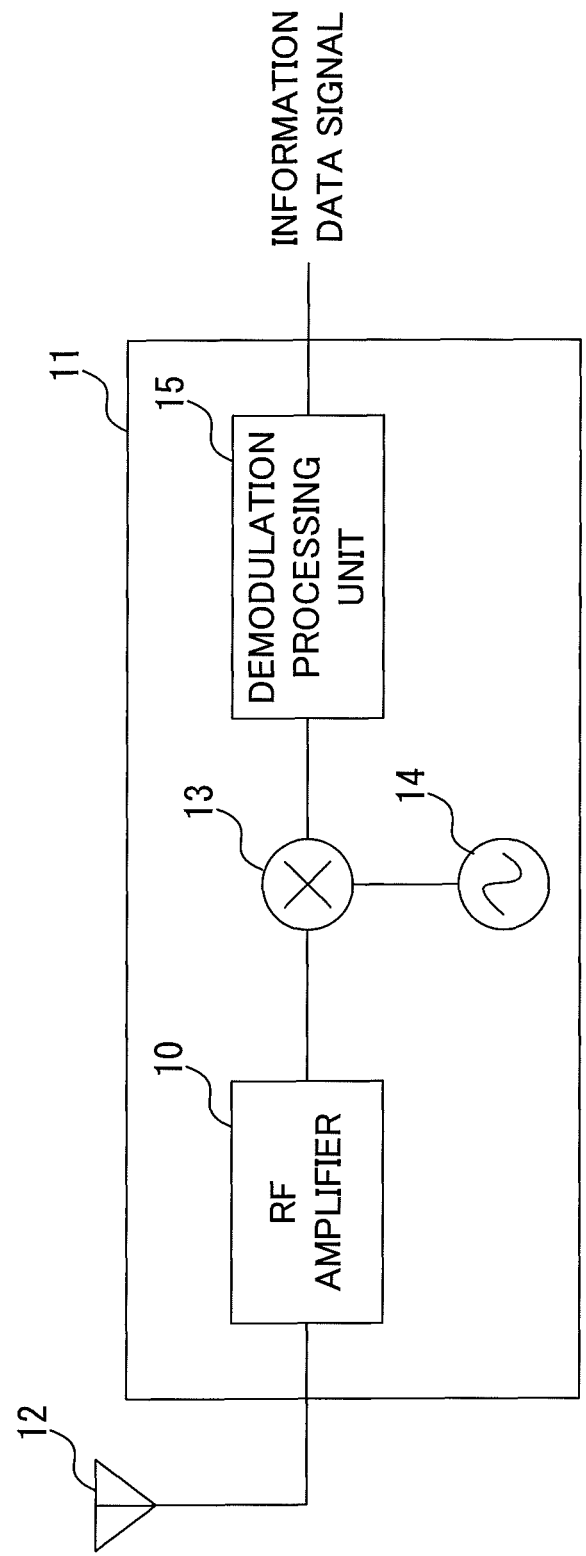
FIG. 1 is a block diagram illustrating a configuration of a receiver including a high-frequency amplifier circuit according to the present invention.

An embodiment of the present invention will be described below in detail with reference to the drawings. FIG. 1 is a block diagram illustrating a configuration of a receiver 11 using a high-frequency amplifier circuit 10 according to the present invention. The high-frequency amplifier circuit 10 amplifies a high-frequency signal input from an antenna 12 and supplies the amplified signal to a mixer 13. The mixer 13 mixes the signal, supplied by the high-frequency amplifier circuit 10, with a local signal, supplied by a local oscillation circuit 14, for conversion into an intermediate frequency. The mixer 13 supplies the obtained intermediate-frequency signal to a demodulation processing unit 15. The demodulation processing unit 15 performs a predetermined demodulation process on the intermediate-frequency signal to obtain an information data signal.

Figure 2:
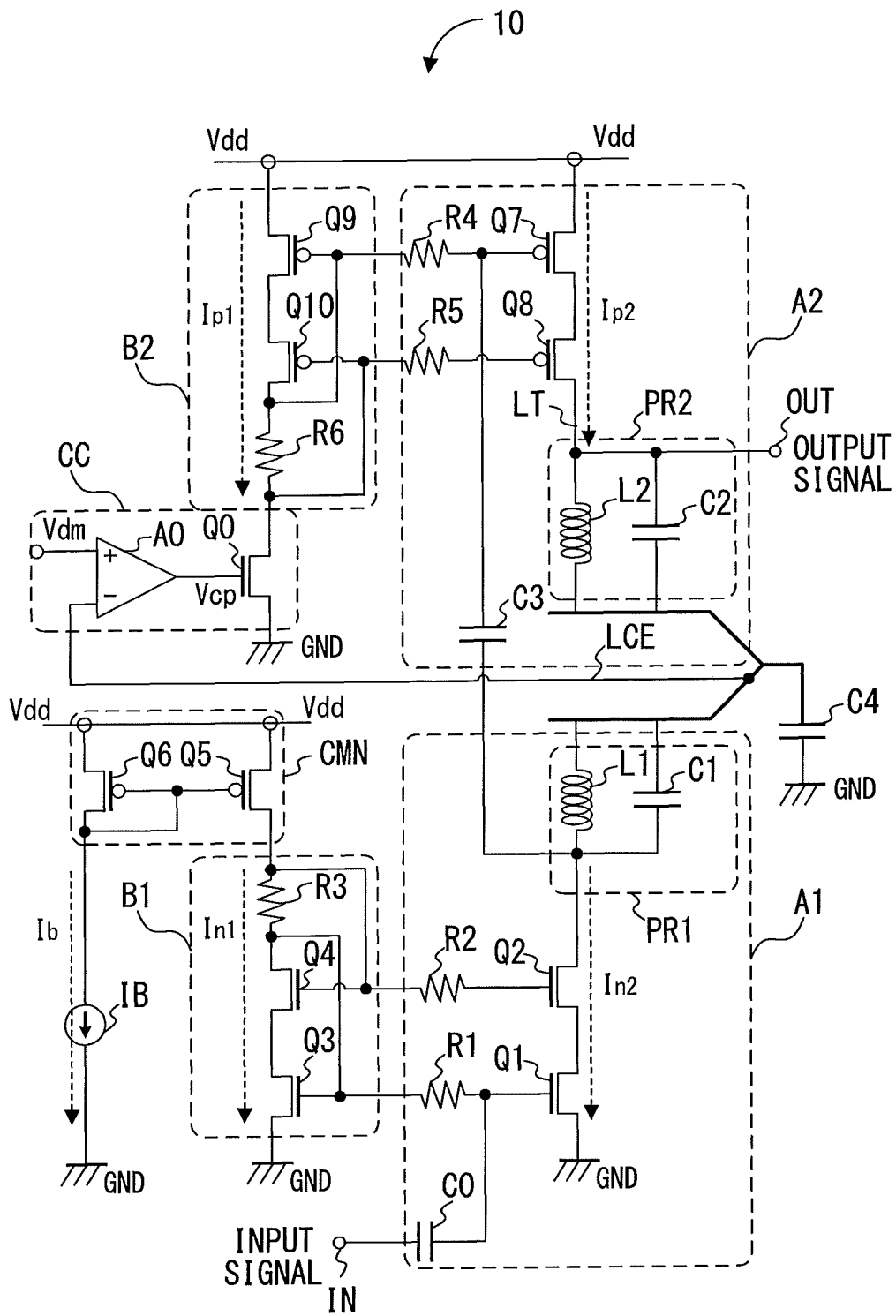
FIG. 2 is a circuit diagram illustrating a configuration of a high-frequency amplifier circuit according to a first embodiment of the present invention.

FIG. 2 is a circuit diagram illustrating a configuration of the high-frequency amplifier circuit 10 according to the first embodiment of the present invention. An input terminal IN is connected to one end of a capacitor C0 that cuts a direct-current component of an input signal. The other end of the capacitor C0 is connected to one end of a resistor R1 and a gate terminal of an N-channel (first conductivity type) MOS (metal-oxide-semiconductor) FET (field effect transistor) (hereinafter referred to as an NMOS transistor) Q1. A source terminal of the NMOS transistor Q1 is grounded and supplied with a ground potential (first potential). A drain terminal of the NMOS transistor Q1 is connected to a source terminal of an NMOS transistor Q2.

A gate terminal of the NMOS transistor Q2 is connected to one end of a resistor R2. A drain terminal of the NMOS transistor Q2 is connected to one end of each of an inductor L1 and a capacitor C1 together constituting a first parallel resonant circuit PR1.

The one end of each of the inductor L1 and the capacitor C1 is connected to one end of a capacitor C3. The other end of each of the inductor L1 and the capacitor C1 is connected to an intermediate potential line LCE.

The NMOS transistor Q1, the NMOS transistor Q2, the resistor R1, the resistor R2, the capacitor C0, and the first parallel resonant circuit PR1 (L1 and C1) together constitute a first amplification unit A1, which is a first-stage amplification unit.

A source terminal of an NMOS transistor Q3 is grounded, a drain terminal thereof is connected to a source terminal of an NMOS transistor Q4, and a gate terminal thereof is connected to a drain terminal of the NMOS transistor Q4, one end of a resistor R3, and the other end of the resistor R1. A gate terminal of the NMOS transistor Q4 is connected to a drain terminal of a P-channel (second conductivity type) MOS FET (hereinafter referred to as a PMOS transistor) Q5, the other end of the resistor R3, and the other end of the resistor R2. The NMOS transistor Q3, the NMOS transistor Q4, and the resistor R3 together constitute a first bias unit B1.

A source terminal of the PMOS transistor Q5 is supplied with a power-supply potential (second potential) Vdd, and a gate terminal thereof is connected to a gate terminal of a PMOS transistor Q6. A source terminal of the PMOS transistor Q6 is supplied with the power-supply potential Vdd, and the gate terminal and a drain terminal thereof are connected to a current source IB. The PMOS transistors Q5 and Q6 together constitute a current mirror circuit CMN. The current source IB and the current mirror circuit CMN constitute a current generating unit.

A source terminal of a PMOS transistor Q7 is supplied with the power-supply potential Vdd, and a drain terminal thereof is connected to a source terminal of a PMOS transistor Q8. A gate terminal of the PMOS transistor Q7 is connected to one end of a resistor R4 and the other end of the capacitor C3.

A gate terminal of the PMOS transistor Q8 is connected to one end of a resistor R5, and a drain terminal thereof is connected to one end of each of an inductor L2 and a capacitor C2 via an output line LT. An output terminal OUT is connected to the output line LT.

The inductor L2 and the capacitor C2 are connected in parallel to constitute a second parallel resonant circuit PR2. The other end of each of the inductor L2 and the capacitor C2 is connected to the intermediate potential line LCE.

The PMOS transistor Q7, the PMOS transistor Q8, the resistor R4, the resistor R5, the capacitor C3, and the second parallel resonant circuit PR2 (L2 and C2) together constitute a second amplification unit A2, which is a second-stage amplification unit.

A source terminal of a PMOS transistor Q9 is supplied with the power-supply potential Vdd, a drain terminal thereof is connected to a source terminal of a PMOS transistor Q10, and a gate terminal thereof is connected to a drain terminal of the PMOS transistor Q10, one end of a resistor R6, and the other end of the resistor R4. A gate terminal of the PMOS transistor Q10 is connected to a drain terminal of an NMOS transistor Q0, the other end of the resistor R6, and the other end of the resistor R5. The PMOS transistors Q9 and Q10 and the resistor R6 together constitute a second bias unit B2.

A source terminal of the NMOS transistor Q0 is grounded, and a gate terminal thereof is connected to an output terminal of an operational amplifier AO.

A direct-current voltage set as an intermediate potential Vdm (e.g., Vdd/2) is applied to a non-inverting input terminal of the operational amplifier AO. An inverting input terminal of the operational amplifier AO is connected to the intermediate potential line LCE. One end of a capacitor C4 is connected to the intermediate potential line LCE. The other end of the capacitor C4 is grounded.

The NMOS transistor Q0 and the operational amplifier AO together constitute a current control unit CC for controlling an operating current for the second bias unit B2.

In the high-frequency amplifier circuit 10 having the above-described configuration, a small signal gain in each of the first amplification unit A1 and the second amplification unit A2 is determined according to a direct-current operating point thereof. A direct-current operation of the high-frequency amplifier circuit 10 will now be described below. In the following description, the first amplification unit A1, the first bias unit B1, the current mirror circuit CMN, and the current source IB are referred to as the first stage, and the second amplification unit A2, the second bias unit B2, and the current control unit CC are referred to as a second stage.

[First Stage]

First, when a current Ib flows through the PMOS transistor Q6 by the current source IB, a current In1 equal to the current Ib or obtained by increasing the current Ib at a predetermined ratio flows, as an operating current of the first bias unit B1, through the first bias unit B1 that includes the resistor R3 and the NMOS transistors Q4 and Q3 by the current mirror circuit CMN.

A gate direct-current voltage of each transistor is determined by a drain current thereof. Thus, the gate direct-current voltage of each of the NMOS transistors Q3 and Q4 is determined by the current In1.

The gate direct-current voltage of the NMOS transistor Q3 is applied to the NMOS transistor Q1 as a bias voltage via the resistor R1. Similarly, the gate direct-current voltage of the NMOS transistor Q4 is applied to the NMOS transistor Q2 as a bias voltage via the resistor R2.

A drain current In2 in each of the NMOS transistors Q1 and Q2 is determined by the bias voltage applied to the gate terminal thereof.

[Second Stage]

A current Ip1, corresponding to a gate voltage Vcp supplied by the operational amplifier AO, flows through the PMOS transistors Q9 and Q10 and the resistor R6 in the second bias unit B2. Here, the gate voltage Vcp is a voltage corresponding to a potential difference between a potential of the intermediate potential line LCE and the intermediate potential Vdm. In other words, the current control unit CC controls the operating current Ip1 for the second bias unit B2 on the basis of the potential difference between the potential of the intermediate potential line LCE and the direct-current voltage set as the intermediate potential Vdm.

A gate direct-current voltage of each of the PMOS transistors Q9 and Q10 is determined by the current Ip1. The gate direct-current voltage of the PMOS transistor Q9 is applied to the PMOS transistor Q7 as a bias voltage via the resistor R4. Similarly, the gate direct-current voltage of the PMOS transistor Q10 is applied to the PMOS transistor Q8 as a bias voltage via the resistor R5.

A drain current Ip2 in each of the PMOS transistors Q7 and Q8 is determined by the bias voltage applied to the gate terminal thereof.

The current Ip2 passes, from the power-supply potential Vdd, through the PMOS transistors Q7 and Q8, the inductor L2, and the intermediate potential line LCE and then flows into the inductor L1 and the NMOS transistors Q2 and Q1 in the first stage. Here, the current Ip2 becomes equal to the current In2 since the current in the NMOS transistors Q1 and Q2 is the current In2. Due to the flowing of such a current Ip2, the intermediate potential line LCE has the potential corresponding to the current Ip2. Note that the current Ip2 corresponds to the gate voltage Vcp supplied by the operational amplifier AO, i.e., the potential difference between the potential of the intermediate potential line LCE and the intermediate potential Vdm. Here, the operational amplifier AO generates the gate voltage Vcp having a voltage value that makes the potential of the intermediate potential line LCE equal to the intermediate potential Vdm by means of a loop configured by the current control unit CC, the second bias unit B2, the second amplification unit A2, and the intermediate potential line LCE. As a result, the intermediate potential line LCE is forcedly set at the potential equal to the intermediate potential Vdm. In the present embodiment, Vdd/2 is set as the intermediate potential Vdm, and the current Ip2 flowing through the second amplification unit A2 becomes equal to the current In2 flowing through the first amplification unit A1.

Those described above determine the direct-current operating point of the high-frequency amplifier circuit 10. On the basis of this direct-current operating point, mutual conductance gmn of the first amplification unit A1 and mutual conductance gmp of the second amplification unit A2 in the high-frequency amplifier circuit 10 are determined. With a resonance load of the first parallel resonant circuit PR1, configured by the inductor L1 and the capacitor C1, being Z1 and a resonance load of the second parallel resonant circuit PR2, configured by the inductor L2 and the capacitor C2, being Z2, the small signal gain of the first amplification unit A1 equals gmn·Z1 and the small signal gain of the second amplification unit A2 equals gmp·Z2. Note that inductance (L1) of the inductor L1, capacitance (C1) of the capacitor C1, inductance (L2) of the inductor L2, and capacitance (C2) of the capacitor C2 are determined so as to satisfy the following expression for a frequency fs to be amplified.

$$fs = \frac{1}{2\pi\sqrt{L1 \cdot C1}} = \frac{1}{2\pi\sqrt{L2 \cdot C2}}$$

The first amplification unit A1 amplifies a high-frequency signal input from the input terminal IN into the gate terminal of the NMOS transistor Q1 via the capacitor C0 by a factor of gmn·Z1 to generate a high-frequency amplified signal. The first amplification unit A1 supplies the high-frequency amplified signal to the second amplification unit A2 via the capacitor C3. The second amplification unit A2 further amplifies this high-frequency amplified signal by a factor of gmp·Z2 to generate an output signal. The second amplification unit A2 outputs this output signal from the output terminal OUT.

The high-frequency amplifier circuit 10 of the present invention is configured by connecting, in cascode, the first amplification unit A1 in which the two transistors are cascode-connected and the second amplification unit A2 in which the two transistors are cascode-connected. Therefore, parasitic capacitance in a path from the output terminal OUT to the input terminal IN is small. Thus, the characteristic of blocking a signal flowing from the output terminal OUT toward the input terminal IN, i.e., the reverse isolation characteristic, is high.

Moreover, in the high-frequency amplifier circuit 10 of the present invention, the first amplification unit A1 and the first bias unit B1 are configured by the NMOS transistors, whereas the second amplification unit A2 and the second bias unit B2 are configured by the PMOS transistors. Furthermore, in the high-frequency amplifier circuit 10, the potential of the intermediate potential line LCE can be set to any potential in order to reuse the current flowing through the second amplification unit A2 in the first amplification unit A1, i.e., in order to make the current In2 flowing through the first amplification unit A1 and the current Ip2 flowing through the second amplification unit A2 equal to each other. In other words, by supplying the intermediate potential Vdm (e.g., a half of Vdd) to the non-inverting input terminal of the operational amplifier AO, the potential of the intermediate potential line LCE can be set to the potential equal to the intermediate potential Vdm.

In the high-frequency amplifier circuit 10 having such a configuration, the ground potential and the intermediate potential Vdm are supplied to the first amplification unit A1. The power-supply potential Vdd and the intermediate potential Vdm are supplied to the second amplification unit A2.

According to the above-described configuration, the first bias unit B1 is connected to a first current path (Q5, R3, Q4, and Q3) in which the power-supply potential is applied to one end thereof and the ground potential is applied to the other end thereof. The second bias unit B2 is connected to a second current path (Q9, Q10, R6, and Q0), different from the first current path, in which the power-supply potential is applied to one end thereof and the ground potential is applied to the other end thereof. The first bias unit B1 and the second bias unit B2 each generate a bias voltage and operate the first amplification unit A1 and the second amplification unit A2, respectively. Thus, as compared with the case where two bias units are connected to the same current path and each generate a bias voltage, the power-supply potential Vdd required for the operation can be made low.

Here, a required minimum value as the power-supply potential Vdd is as follows.

$$Vdd=\max(Vdsn+Vgsnc+|Vpi|, |Vdsp|+|Vgspc|+Vni)$$

Vdsn: a drain-source voltage in Q1
Vgsnc: a gate-source voltage in Q2
Vpi: a source-drain voltage in Q5
Vdsp: a source-drain voltage in Q7
Vgspc: a source-gate voltage in Q8
Vni: a source-drain voltage Q0

In a configuration in which a plurality of transistors are connected in cascode, for example, it is typically required to generate a bias voltage by dropping the power-supply potential by an amount corresponding to the number of stages same as the number of transistor stages in each of which a voltage drop is generated by an amplification unit. According to the high-frequency amplifier circuit 10 of the present invention, on the other hand, whereas an amount of voltage drop due to the cascode connection of the first amplification unit A1 and the second amplification unit A2 is an amount corresponding to the four stages of the MOS transistors (Q1, Q2, Q7, and Q8), the power-supply potential Vdd only needs to have a value equal to an amount of voltage drop for the three stages of the MOS transistors as described above.

More specifically, according to the present invention, the first amplification unit A1 and the first bias unit B1 and the second amplification unit A2 and the second bias unit B2 are configured by the transistors having opposite conductivity types (NMOS transistors and PMOS transistors). As a result, bias voltages can be generated in different current paths. Thus, the value of the power-supply potential Vdd can be set to a value lower than the amount of voltage drop in the amplification units. As compared with the conventional high-frequency amplifier circuit that requires the power-supply potential corresponding to the amount of voltage drop for the four stages of the MOS transistors, the power-supply potential Vdd can be set to a lower value. Thus, in the high-frequency amplifier circuit 10, the current flowing through the second amplification unit A2 can be reused in the first amplification unit A1 and the power-supply potential can be lowered. As a result, the power consumption can be significantly reduced.

Figure 3:
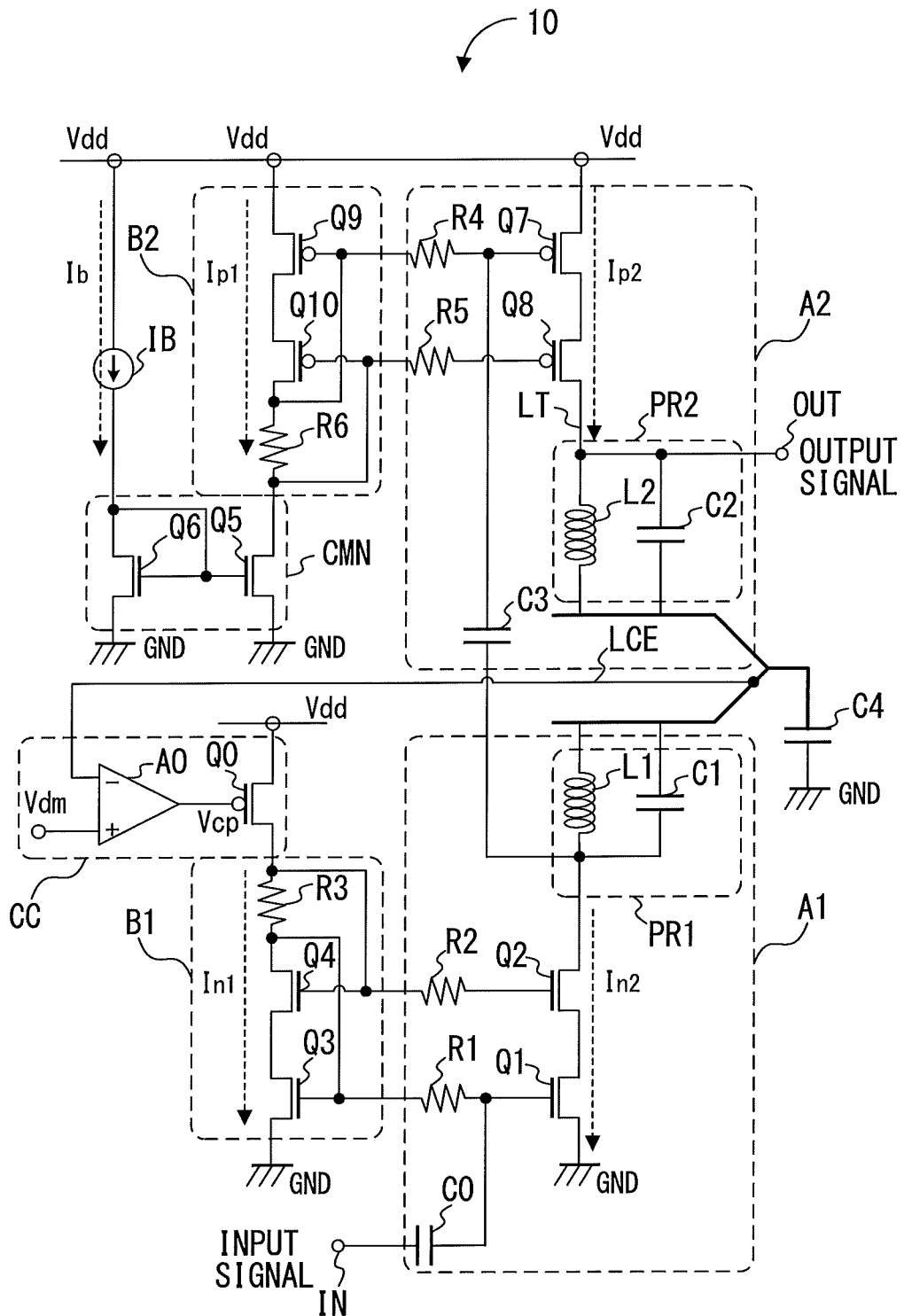
FIG. 3 is a circuit diagram illustrating another configuration of the high-frequency amplifier circuit according to the first embodiment of the present invention.

Unlike the above-described configuration, the current source IB and the current mirror circuit CMN (i.e., the current generating unit) may be provided in the second stage and the current control unit CC may be provided in the first stage as shown in FIG. 3, for example. In the high-frequency amplifier circuit 10 shown in FIG. 3, first, when the current Ib flows through the NMOS transistor Q6 by the current source IB, the current Ip1 equal to the current Ib or obtained by increasing the current Ib at a predetermined ratio flows, as an operating current of the second bias unit B2, through the second bias unit B2 that includes the PMOS transistors Q9 and Q10 and the resistor R6 by the current mirror circuit CMN. The current Ip1 determines the gate direct-current voltages of the PMOS transistors Q9 and Q10.

The gate direct-current voltage of the PMOS transistor Q9 is applied to the PMOS transistor Q7 as a bias voltage via the resistor R4. Similarly, the gate direct-current voltage of the PMOS transistor Q10 is applied to the PMOS transistor Q8 as a bias voltage via the resistor R5. The drain current Ip2 in each of the PMOS transistors Q7 and Q8 is determined by the bias voltage applied to the gate thereof.

The current In1, corresponding to the gate voltage Vcp supplied by the operational amplifier AO, flows through the resistor R3 and the NMOS transistors Q4 and Q3 in the first bias unit B1. Here, the gate voltage Vcp is a voltage corresponding to the potential difference between the potential of the intermediate potential line LCE and the intermediate potential Vdm. In other words, the current control unit CC controls the operating current In1 of the first bias unit B1 on the basis of the potential difference between the potential of the intermediate potential line LCE and the direct-current voltage set as the intermediate potential Vdm.

The gate direct-current voltage of each of the NMOS transistors Q4 and Q3 is determined by the current In1. The gate direct-current voltage of the NMOS transistor Q3 is applied to the NMOS transistor Q1 as a bias voltage via the resistor R1. The gate direct-current voltage of the NMOS transistor Q4 is applied to the NMOS transistor Q2 as a bias voltage via the resistor R2. The drain current In2 in each of the NMOS transistors Q1 and Q2 is determined by the bias voltage applied to the gate terminal thereof. Those described above determine the direct-current operating point.

The high-frequency amplifier circuit 10 shown in FIG. 3 is configured by connecting, in cascode, the first amplification unit A1 and the second amplification unit A2 in each of which the two transistors are cascode-connected. Therefore, parasitic capacitance in the path from the output terminal OUT to the input terminal IN is small and the reverse isolation characteristic is high. Moreover, the current flowing through the second amplification unit A2 can be reused in the first amplification unit A1. As with the circuit shown in FIG. 2, the first bias unit B1 and the second bias unit B2 are operated while being connected to different current paths in each of which the power-supply potential Vdd and the ground potential are supplied to the opposite ends thereof. As a result, the power-supply potential Vdd can be made low. Thus, a power consumption can be significantly reduced.

Second Embodiment

Figure 4:
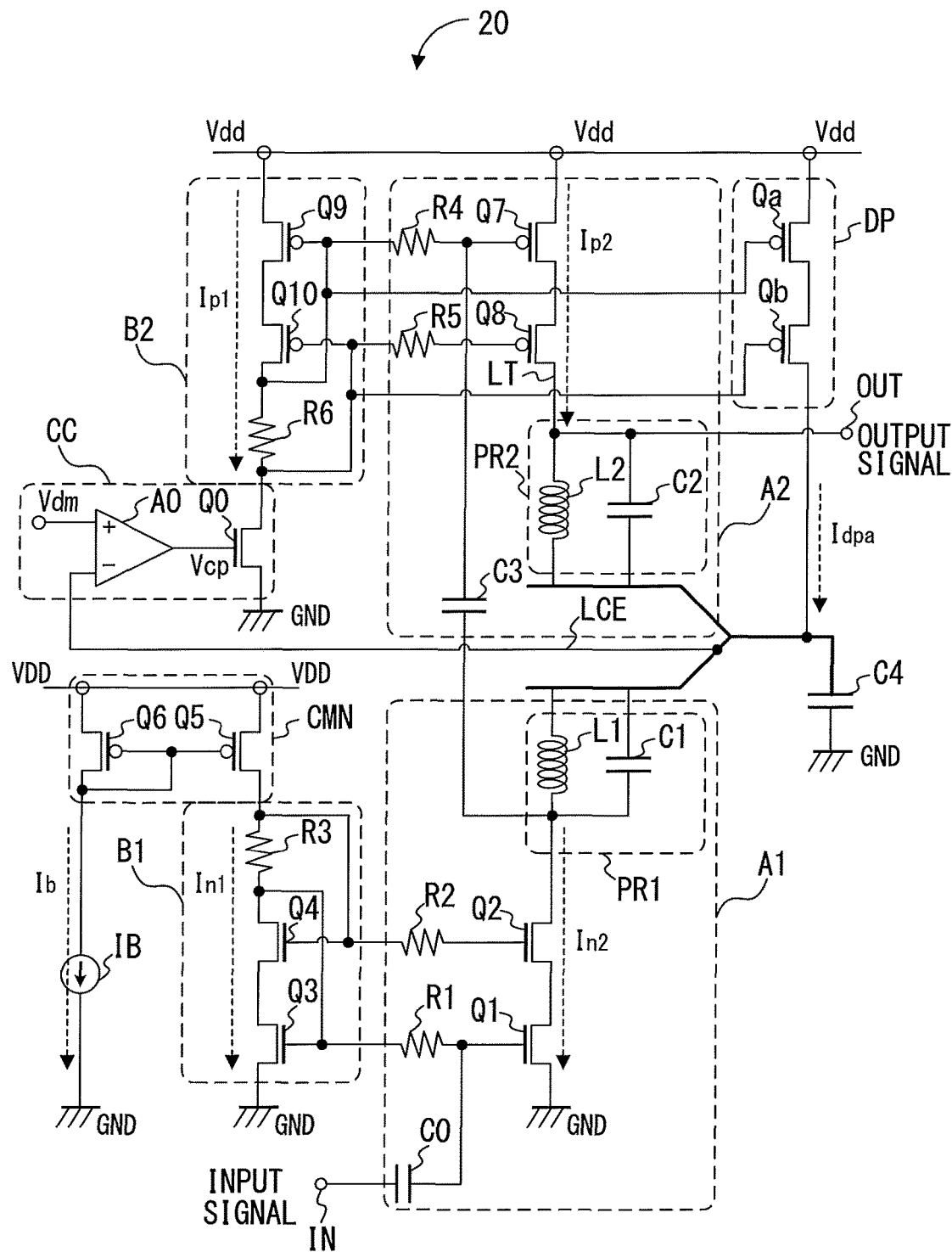
FIG. 4 is a circuit diagram illustrating a configuration of a high-frequency amplifier circuit according to a second embodiment of the present invention.

FIG. 4 is a diagram illustrating a configuration of a high-frequency amplifier circuit 20 according to the second embodiment of the present invention. The high-frequency amplifier circuit 20 differs from the high-frequency amplifier circuit 10 of the first embodiment in that a current adjustment unit DP is included. Regarding other components, the high-frequency amplifier circuit 20 has a configuration similar to that of the high-frequency amplifier circuit 10 of the first embodiment.

The current adjustment unit DP is configured by PMOS transistors Qa and Qb. A source terminal of the PMOS transistor Qa is supplied with a power-supply potential Vdd, a drain terminal thereof is connected to a source terminal of the PMOS transistor Qb, and a gate terminal thereof is connected to a gate terminal of a PMOS transistor Q9. A drain terminal of the PMOS transistor Qb is connected to an intermediate potential line LCE, and a gate terminal thereof is connected to a gate terminal of a PMOS transistor Q10.

A gate direct-current voltage of the PMOS transistor Q9 is applied to the gate of the PMOS transistor Qa as a bias voltage. A gate direct-current voltage of the PMOS transistor Q10 is applied to the gate of the PMOS transistor Qb as a bias voltage. The bias voltages applied to the gates of the PMOS transistors Qa and Qb determine a current Idpa flowing through the current adjustment unit DP.

A current Ip2 flowing through a second amplification unit A2 and the current Idpa flowing through the current adjustment unit DP flow into a first amplification unit A1. Therefore, a current In2 flowing through the first amplification unit A1 satisfies In2=Ip2+Idpa.

According to the above-described configuration, the operating current for the first amplification unit A1 and the operating current for the second amplification unit A2 can be set separately. Moreover, since direct-current operating points can be set separately, a small signal gain of the first amplification unit A1 and a small signal gain of the second amplification unit A2 can be set independently. In other words, small signal gains can be designed with a high degree of flexibility.

Figure 5:
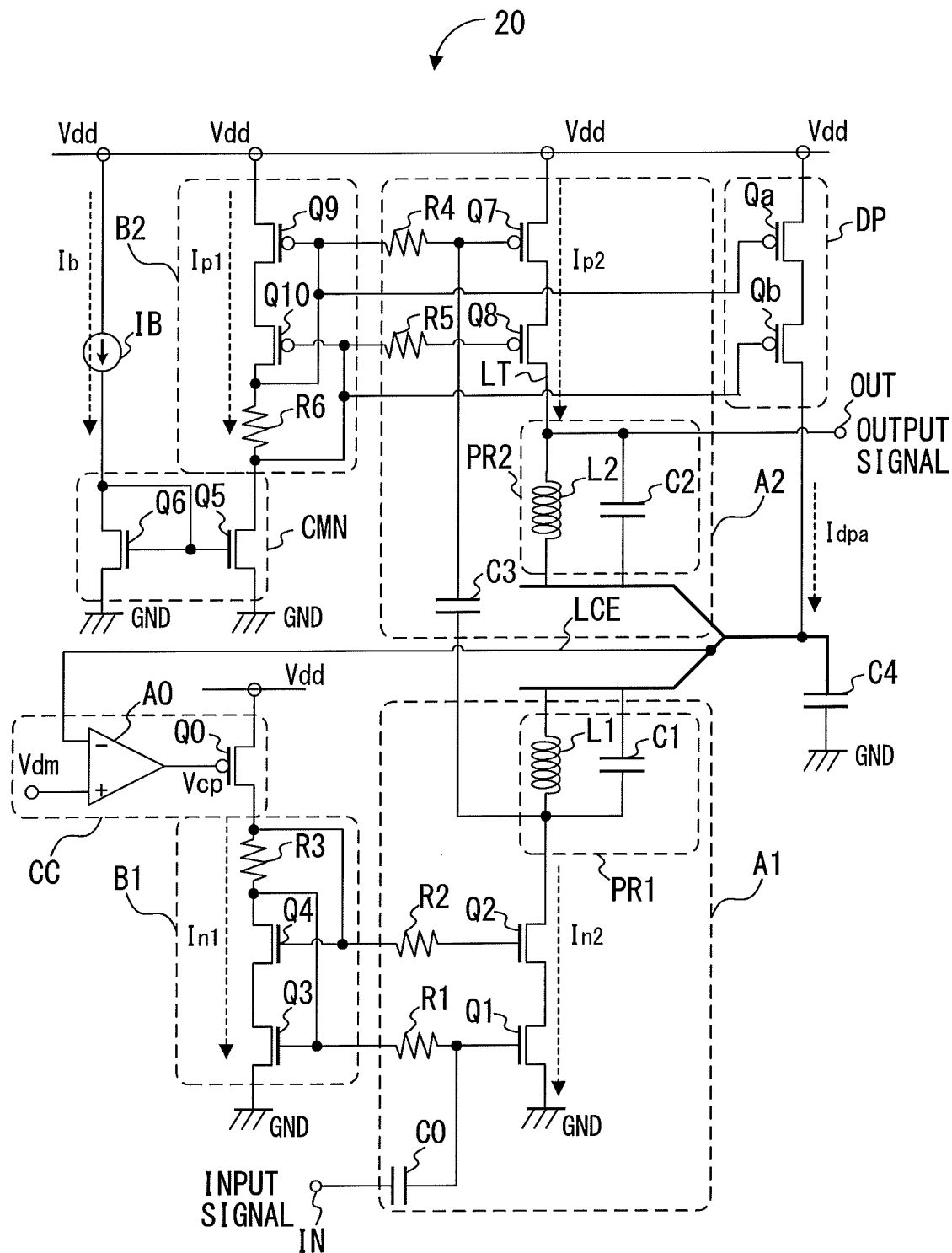
FIG. 5 is a circuit diagram illustrating another configuration of the high-frequency amplifier circuit according to the second embodiment of the present invention.

Note that the current adjustment unit DP may be added to a configuration in which a current control unit CC is provided in the first stage and a current source IB and a current mirror circuit CMN are provided in the second stage (i.e., the configuration in FIG. 3) as shown in FIG. 5. In this configuration, the current In2 flowing through the first amplification unit A1 satisfies In2=Ip2+Idpa. Thus, the operating current for the first amplification unit A1 and the operating current for the second amplification unit A2 can be set separately. Moreover, since direct-current operating points can be set separately, a small signal gain of the first amplification unit A1 and a small signal gain of the second amplification unit A2 can be set independently.

Figure 6:
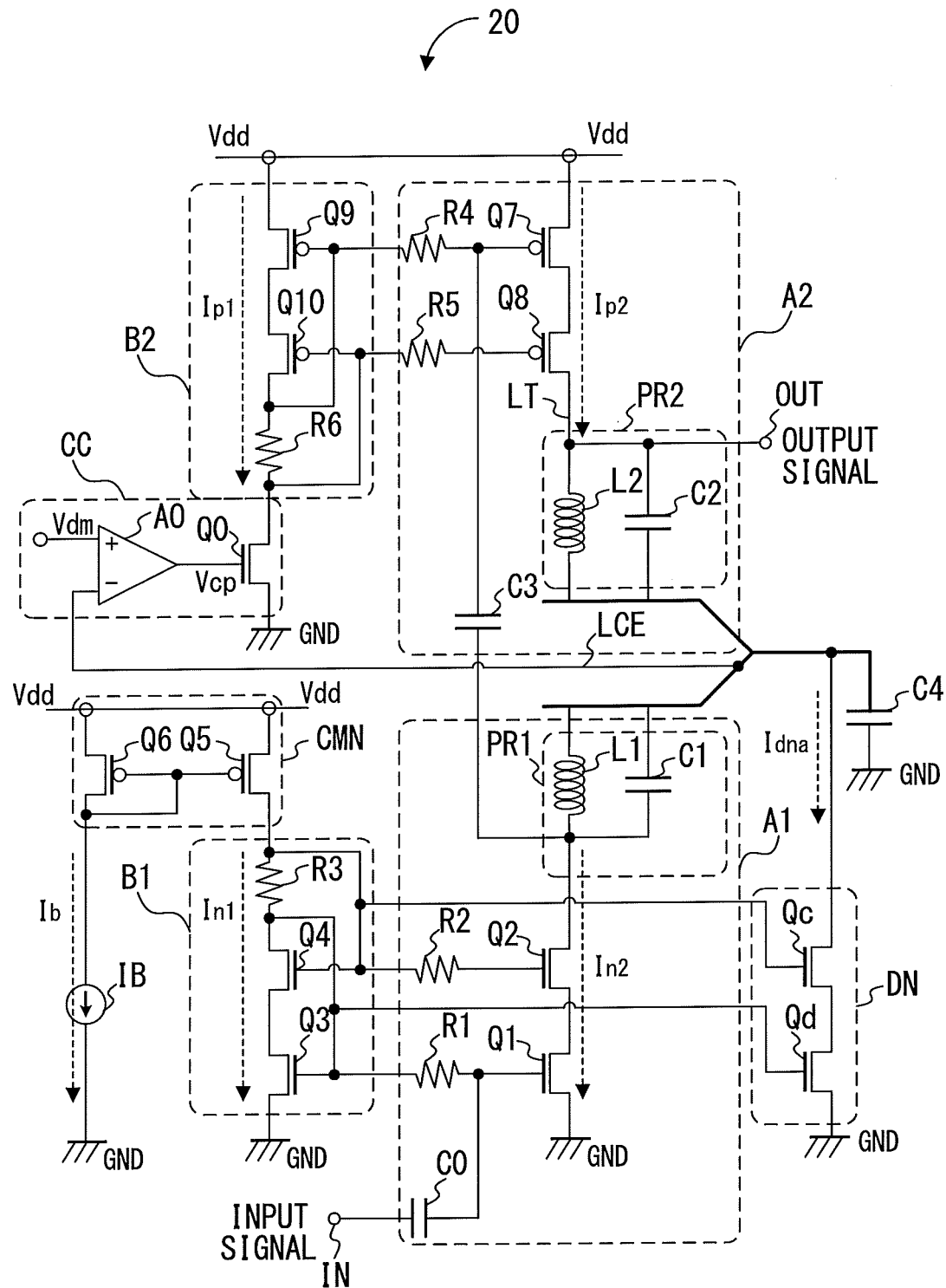
FIG. 6 is a circuit diagram illustrating still another configuration of the high-frequency amplifier circuit according to the second embodiment of the present invention.

Unlike the configuration in FIG. 4, a current adjustment unit DN may be provided in the first stage as shown in FIG. 6. The current adjustment unit DN is configured by NMOS transistors Qc and Qd. A drain terminal of the NMOS transistor Qc is connected to the intermediate potential line LCE, a source terminal thereof is connected to a drain terminal of the NMOS transistor Qd, and a gate terminal thereof is connected to a gate terminal of an NMOS transistor Q4. A source terminal of the NMOS transistor Qd is grounded, and a gate terminal thereof is connected to a gate terminal of an NMOS transistor Q3.

A gate direct-current voltage of the NMOS transistor Q3 is applied to the gate of the NMOS transistor Qd as a bias voltage. A gate direct-current voltage of the NMOS transistor Q4 is applied to the gate of the NMOS transistor Qc as a bias voltage. The bias voltages applied to the gates of the NMOS transistors Qc and Qd determine a current Idna flowing through the current adjustment unit DN.

The current Ip2 flowing through the second amplification unit A2 flows into the first amplification unit A1 and the current adjustment unit DN. Therefore, the current Ip2 flowing through the second amplification unit A2 satisfies Ip2=In2+Idna. Therefore, the operating current for the first amplification unit A1 and the operating current for the second amplification unit A2 can be set separately. Moreover, since direct-current operating points can be set separately, a small signal gain of the first amplification unit A1 and a small signal gain of the second amplification unit A2 can be set independently.

Figure 7:
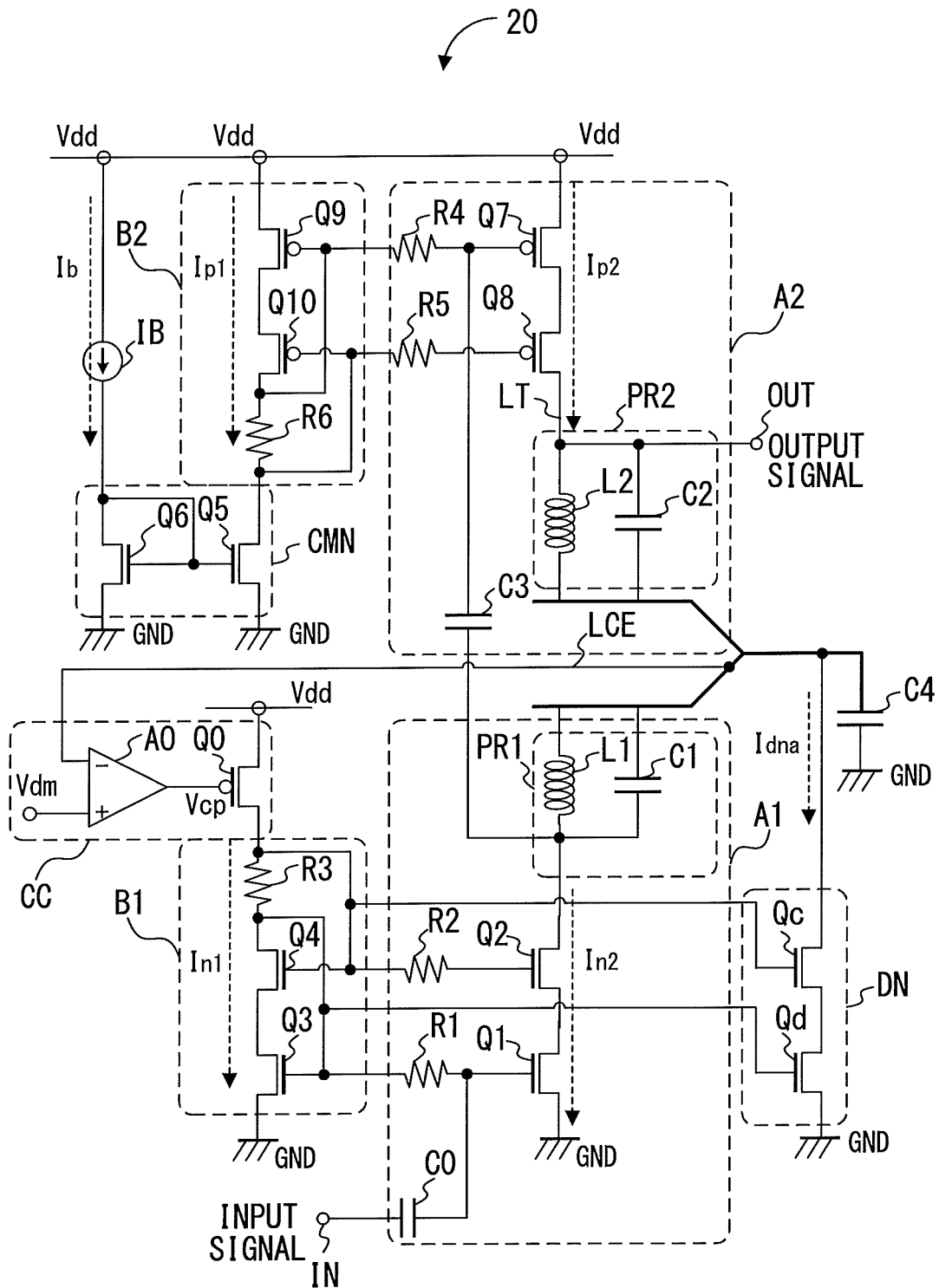
FIG. 7 is a circuit diagram illustrating still another configuration of the high-frequency amplifier circuit according to the second embodiment of the present invention.

Note that the current adjustment unit DN may be added to the configuration in which the current control unit CC is provided in the first stage and the current source IB and the current mirror circuit CMN are provided in the second stage (i.e., the configuration in FIG. 3) as shown in FIG. 7. Also in this configuration, the current Ip2 flowing through the second amplification unit A2 satisfies Ip2=In2+Idna as with the configuration shown in FIG. 6.

According to any of these configurations shown in FIGS. 4 to 7, a difference between the current In2 flowing through the first amplification unit A1 and the current Ip2 flowing through the second amplification unit A2 can be adjusted by an adjustment current by providing the current adjustment unit DN or DP. Thus, the current flowing through the first stage and the current flowing through the second stage can be made equal to achieve current reuse. As a result, a power consumption in the circuit as a whole can be kept low.

Moreover, according to the above-described configurations, since the operating current for the first amplification unit A1 and the operating current for the second amplification unit A2 can be set separately, direct-current operating points can be set separately. Thus, small signal gains can be designed with a high degree of flexibility.

Third Embodiment

Figure 8:
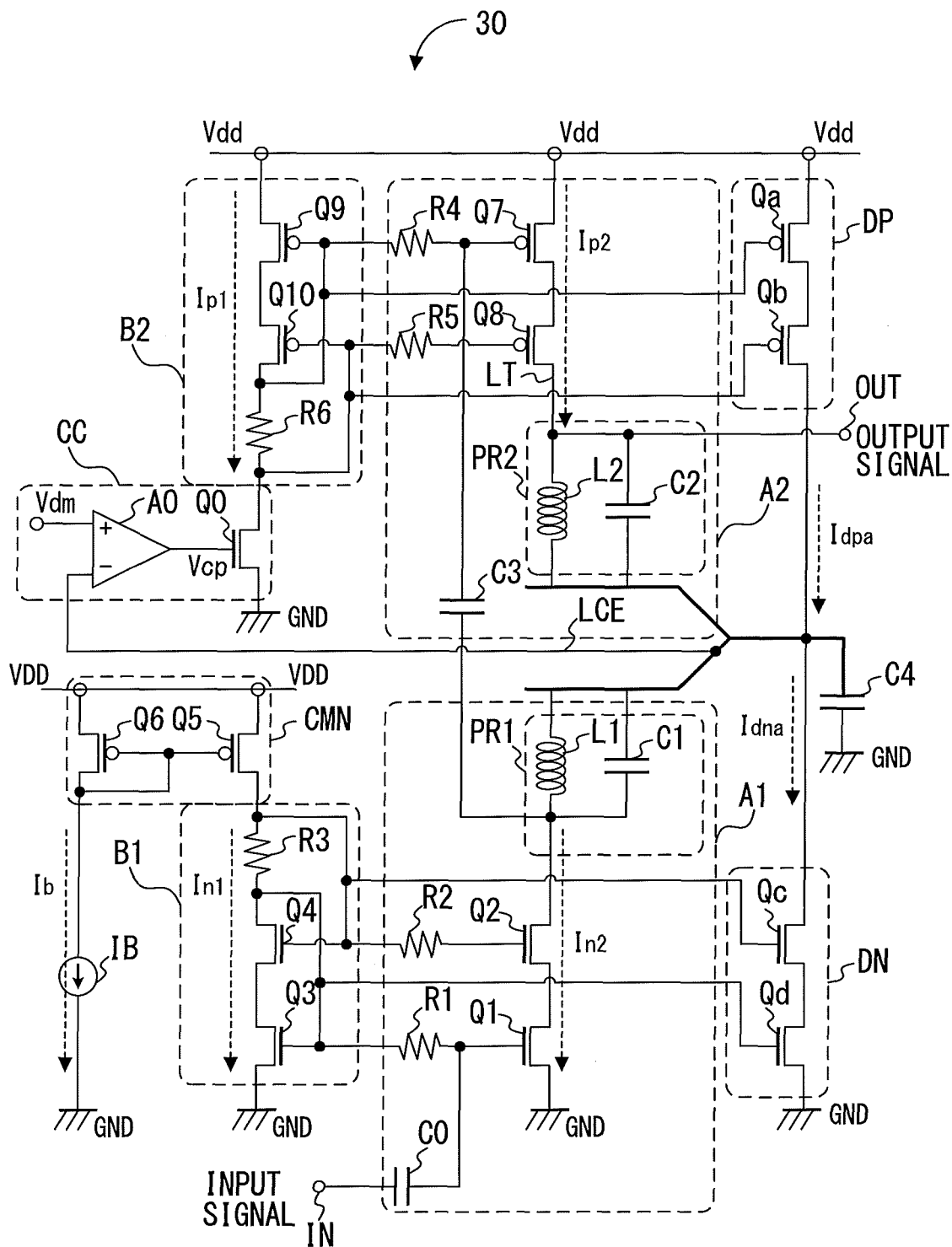
FIG. 8 is a circuit diagram illustrating a configuration of a high-frequency amplifier circuit according to a third embodiment of the present invention.

FIG. 8 is a diagram illustrating a configuration of a high-frequency amplifier circuit 30 according to the third embodiment of the present invention. The high-frequency amplifier circuit 30 differs from the high-frequency amplifier circuit 20 shown in FIGS. 4 and 6 in that both of a current adjustment unit DN, provided in the first stage, and a current adjustment unit DP, provided in the second stage, are included.

A current Ip2 flowing through a second amplification unit A2 and a current Idpa flowing through the current adjustment unit DP flow into a first amplification unit A1 and the current adjustment unit DN. Therefore, a relationship between a current In2 flowing through the first amplification unit A1 and a current Idna flowing through the current adjustment unit DN and the current Ip2 flowing through the second amplification unit A2 and the current Idpa flowing through the current adjustment unit DP satisfies In2+Idna=Ip2+Idpa. According to such a configuration, current adjustment is possible in either of a case where the current In2 flowing through the first amplification unit A1 is larger than the current Ip2 flowing through the second amplification unit A2 and a case where the current Ip2 flowing through the second amplification unit A2 is larger than the current In2 flowing through the first amplification unit A1. Thus, current adjustment can be flexibly performed as the situation demands and the power consumption can be reduced by means of current reuse.

Alternatively, in the high-frequency amplifier circuit 30 of the present embodiment, the first amplification unit A1 may be configured by further connecting, in parallel, a plurality of transistor pairs to NMOS transistors Q1 and Q2, and the second amplification unit A2 may be configured by further connecting, in parallel, a plurality of transistor pairs to PMOS transistors Q7 and Q8. Moreover, a plurality of transistor pairs may be further connected in parallel to NMOS transistors Qc and Qd to constitute the current adjustment unit DN in the first stage, and a plurality of transistor pairs may be further connected in parallel to PMOS transistors Qa and Qb to constitute the current adjustment unit DP in the second stage.

Figure 9:
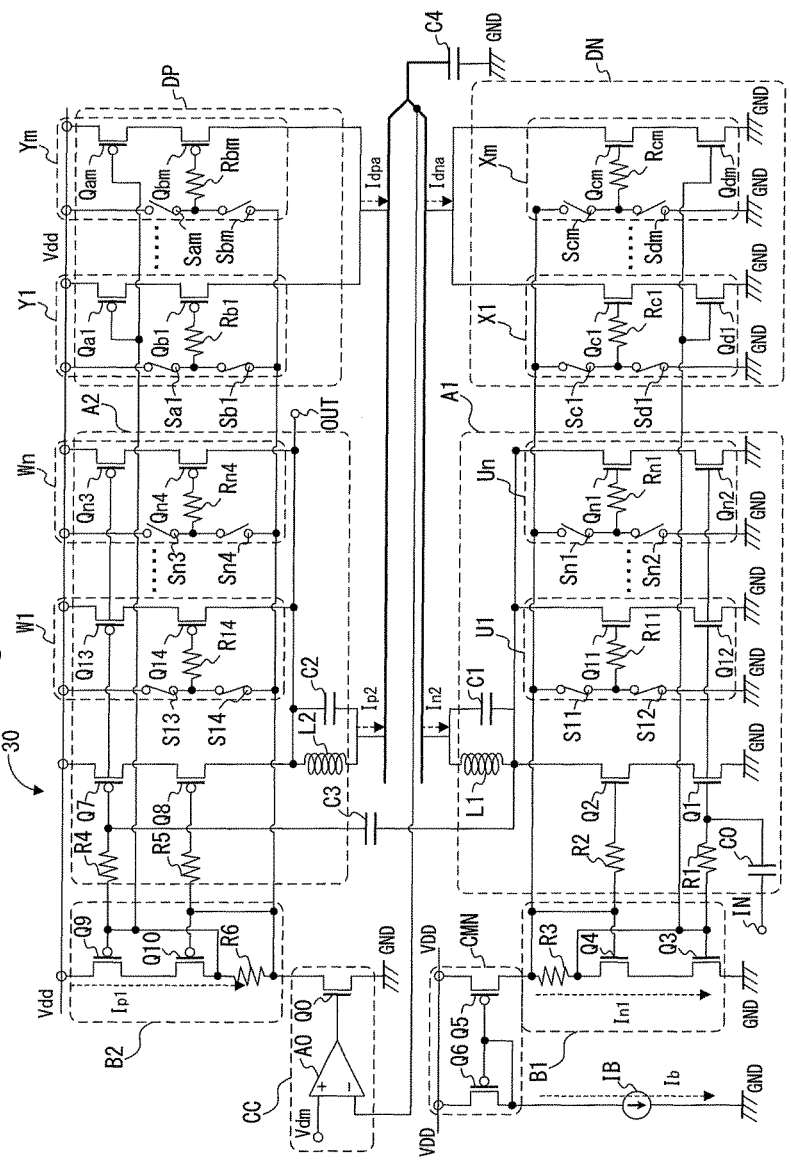
FIG. 9 is a circuit diagram illustrating, in detail, a core portion and current adjustment units in the circuit diagram of FIG. 8.

FIG. 9 is a diagram illustrating the high-frequency amplifier circuit 30 in which a plurality of cascode-connected transistor pairs are connected in parallel to one another in each of the first amplification unit A1, the second amplification unit A2, the current adjustment unit DN, and the current adjustment unit DP.

The first amplification unit A1 has a configuration in which n units U1 to Un, each configured by a pair of cascode-connected NMOS transistors, a resistor, and switches, are connected in parallel to the NMOS transistors Q1 and Q2. The unit U1 includes NMOS transistors Q11 and Q12, a resistor R11, and switches S11 and S12. The unit Un includes NMOS transistors Qn1 and Qn2, a resistor Rn1, and switches Sn1 and Sn2.

In the unit U1, the switches S11 and S12 are changed over so that when one of these switches is turned on, the other is turned off. For example, when the switch S11 is turned on and the switch S12 is turned off, a gate terminal of the NMOS transistor Q11 is connected to a gate terminal of an NMOS transistor Q4 via the resistor R11. Thus, a gate voltage of the NMOS transistor Q4 is applied to the NMOS transistor Q11 as a bias voltage. In other words, the unit U1 is set in an operating state. When the switch S11 is turned off and the switch S12 is turned on, on the other hand, the gate terminal of the NMOS transistor Q11 is grounded, thereby setting the unit U1 in a non-operating state.

Similarly in the unit Un, the switches Sn1 and Sn2 are changed over so that when one of these switches is turned on, the other is turned off. For example, when the switch Sn1 is turned on and the switch Sn2 is turned off, a gate terminal of the NMOS transistor Qn1 is connected to the gate terminal of the NMOS transistor Q4 via the resistor Rn1. Thus, the gate voltage of the NMOS transistor Q4 is applied to the NMOS transistor Qn1 as a bias voltage. In other words, the unit Un is set in an operating state. When the switch Sn1 is turned off and the switch Sn2 is turned on, on the other hand, the gate terminal of the NMOS transistor Qn1 is grounded, thereby setting the unit Un in a non-operating state.

The second amplification unit A2 has a configuration in which n units W1 to Wn, each configured by a pair of cascode-connected PMOS transistors, a resistor, and switches, are connected in parallel to the PMOS transistors Q7 and Q8. The unit W1 includes PMOS transistors Q13 and Q14, a resistor R14, and switches S13 and S14. The unit Wn includes PMOS transistors Qn3 and Qn4, a resistor Rn4, and switches Sn3 and Sn4.

In the unit W1, the switches S13 and S14 are changed over so that when one of these switches is turned on, the other is turned off. For example, when the switch S13 is turned on and the switch S14 is turned off, a gate terminal of the PMOS transistor Q14 is supplied with a power-supply potential Vdd. Thus, the unit W1 is set in a non-operating state. When the switch S13 is turned off and the switch S14 is turned on, on the other hand, the gate terminal of the PMOS transistor Q14 is connected to a gate terminal of a PMOS transistor Q10 via the resistor R14. Thus, a gate voltage of the PMOS transistor Q10 is applied to the PMOS transistor Q14 as a bias voltage, thereby setting the unit W1 in an operating state.

Similarly in the unit Wn, the switches Sn3 and Sn4 are changed over so that when one of these switches is turned on, the other is turned off. For example, when the switch Sn3 is turned on and the switch Sn4 is turned off, a gate terminal of the PMOS transistor Qn4 is provided with the power-supply potential Vdd, thereby setting the unit Wn in a non-operating state. When the switch Sn3 is turned off and the switch Sn4 is turned on, on the other hand, the gate terminal of the PMOS transistor Qn4 is connected to the gate terminal of the PMOS transistor Q10 via the resistor Rn4. Thus, the gate voltage of the PMOS transistor Q10 is applied to the PMOS transistor Qn4 as a bias voltage, thereby setting the unit Wn in an operating state.

The current adjustment unit DN in the first stage has a configuration in which m units X1 to Xm, each configured by a pair of cascode-connected NMOS transistors, a resistor, and switches, are connected in parallel to one another. The unit X1 includes NMOS transistors Qc1 and Qd1, a resistor Rc1, and switches Sc1 and Sd1. The unit Xm includes NMOS transistors Qcm and Qdm, a resistor Rcm, and switches Scm and Sdm.

In the unit X1, the switches Sc1 and Sd1 are changed over so that when one of these switches is turned on, the other is turned off. For example, when the switch Sc1 is turned on and the switch Sd1 is turned off, a gate terminal of the NMOS transistor Qc1 is connected to the gate terminal of the NMOS transistor Q4 via the resistor Rc1. Thus, the gate voltage of the NMOS transistor Q4 is applied to the NMOS transistor Qc1 as a bias voltage. In other words, the unit X1 is set in an operating state. When the switch Sc1 is turned off and the switch Sd1 is turned on, on the other hand, the gate terminal of the NMOS transistor Qc1 is grounded, thereby setting the unit X1 in a non-operating state.

Similarly in the unit Xm, the switches Scm and Sdm are changed over so that when one of these switches is turned on, the other is turned off. For example, when the switch Scm is turned on and the switch Sdm is turned off, a gate terminal of the NMOS transistor Qcm is connected to the gate terminal of the NMOS transistor Q4 via the resistor Rcm. Thus, the gate voltage of the NMOS transistor Q4 is applied to the NMOS transistor Qcm as a bias voltage, thereby setting the unit Xm in an operating state. When the switch Scm is turned off and the switch Sdm is turned on, on the other hand, the gate terminal of the NMOS transistor Qcm is grounded, thereby setting the unit Xm in a non-operating state.

The current adjustment unit DP in the second stage has a configuration in which m units Y1 to Ym, each configured by a pair of cascode-connected PMOS transistors, a resistor, and switches, are connected in parallel to one another. The unit Y1 includes PMOS transistors Qa1 and Qb1, a resistor Rb1, and switches Sa1 and Sb1. The unit Ym includes PMOS transistors Qam and Qbm, a resistor Rbm, and switches Sam and Sbm.

In the unit Y1, the switches Sa1 and Sb1 are changed over so that when one of these switches is turned on, the other is turned off. For example, when the switch Sa1 is turned on and the switch Sb1 is turned off, a gate terminal of the PMOS transistor Qb1 is supplied with the power-supply potential Vdd. Thus, the unit Y1 is set in a non-operating state. When the switch Sa1 is turned off and the switch Sb1 is turned on, on the other hand, the gate terminal of the PMOS transistor Qb1 is connected to the gate terminal of the PMOS transistor Q10 via the resistor Rb1. Thus, the gate voltage of the PMOS transistor Q10 is applied to the PMOS transistor Qb1 as a bias voltage, thereby setting the unit Y1 in an operating state.

Similarly in the unit Ym, the switches Sam and Sbm are changed over so that when one of these switches is turned on, the other is turned off. For example, when the switch Sam is turned on and the switch Sbm is turned off, a gate terminal of the PMOS transistor Qbm is provided with the power-supply potential Vdd. Thus, the unit Ym is set in a non-operating state. When the switch Sam is turned off and the switch Sbm is turned on, on the other hand, the gate terminal of the PMOS transistor Qbm is connected to the gate terminal of the PMOS transistor Q10 via the resistor Rbm. Thus, the gate voltage of the PMOS transistor Q10 is applied to the PMOS transistor Qbm as a bias voltage, thereby setting the unit Ym in an operating state.

As described above, in the high-frequency amplifier circuit 30 of FIG. 9, each of the first amplification unit A1 and the second amplification unit A2 is configured such that the plurality of cascode-connected transistor pairs are connected in parallel to one another and whether to operate each transistor pair can be changed over by means of switching. Thus, the gain of the first amplification unit A1 and the gain of the second amplification unit A2 are variable, and small signal gains can be therefore designed with a high degree of flexibility.

Also, each of the current adjustment unit DN in the first stage and the current adjustment unit DP in the second stage is configured such that the plurality of cascode-connected transistor pairs are connected in parallel to one another and whether to operate each transistor pair can be changed over by means of switching. Thus, adjustment current values in the current adjustment unit DN in the first stage and the current adjustment unit DP in the second stage are variable. Therefore, the difference between the current In2 flowing through the first amplification unit A1 and the current Ip2 flowing through the second amplification unit A2 can be appropriately adjusted as the situation demands.

Figure 10:
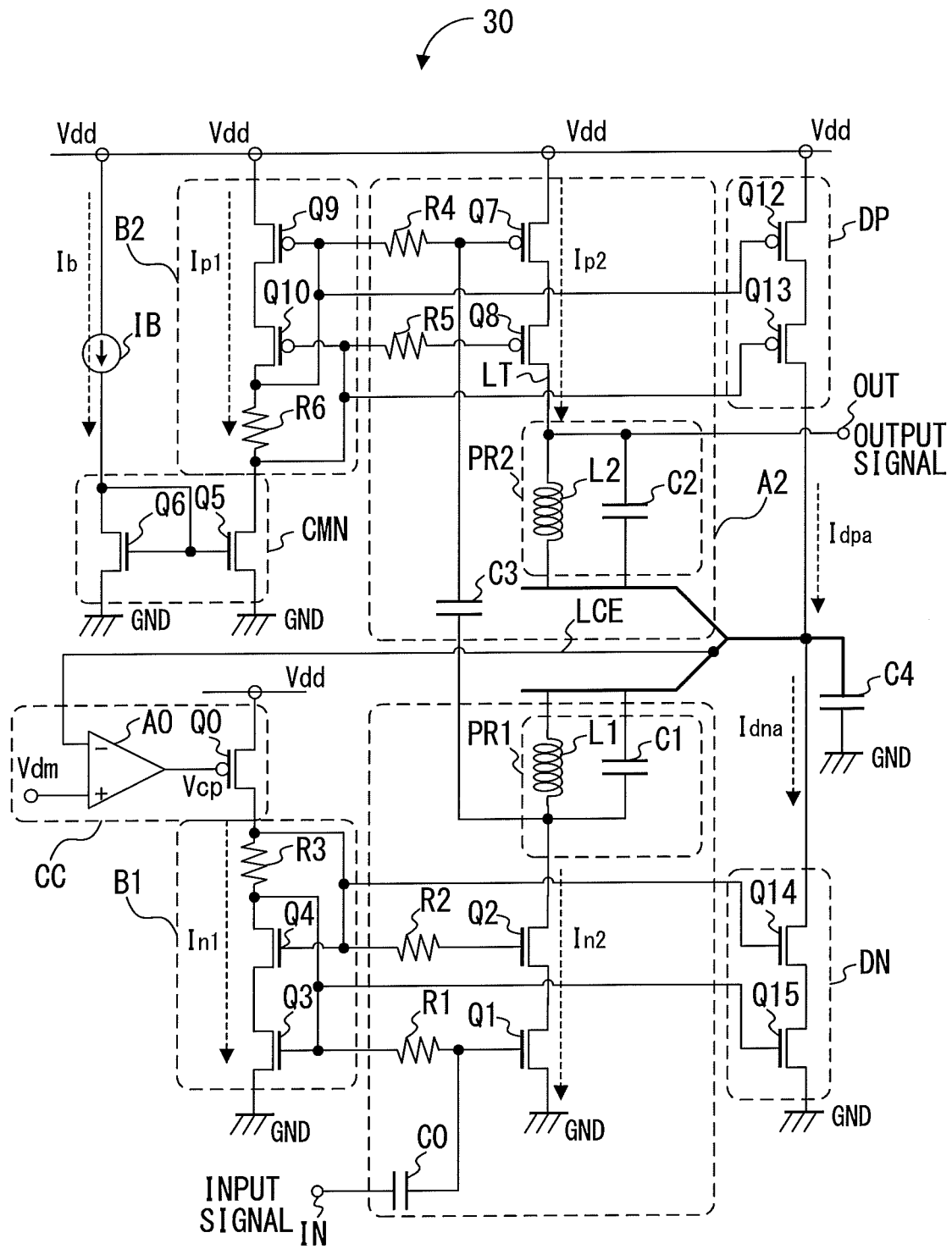
FIG. 10 is a circuit diagram illustrating another configuration of the high-frequency amplifier circuit according to the third embodiment of the present invention.

Note that both of the current adjustment unit DN in the first stage and the current adjustment unit DP in the second stage may be added to a configuration in which a current control unit CC is provided in the first stage and a current source IB and a current mirror circuit CMN are provided in the second stage (i.e., the configuration in FIG. 3) as shown in FIG. 10. As with the configuration of FIG. 8, the relationship between the current In2 flowing through the first amplification unit A1 and the current Idna flowing through the current adjustment unit DN and the current Ip2 flowing through the second amplification unit A2 and the current Idpa flowing through the current adjustment unit DP satisfies In2+Idna=Ip2+Idpa.

Figure 11:
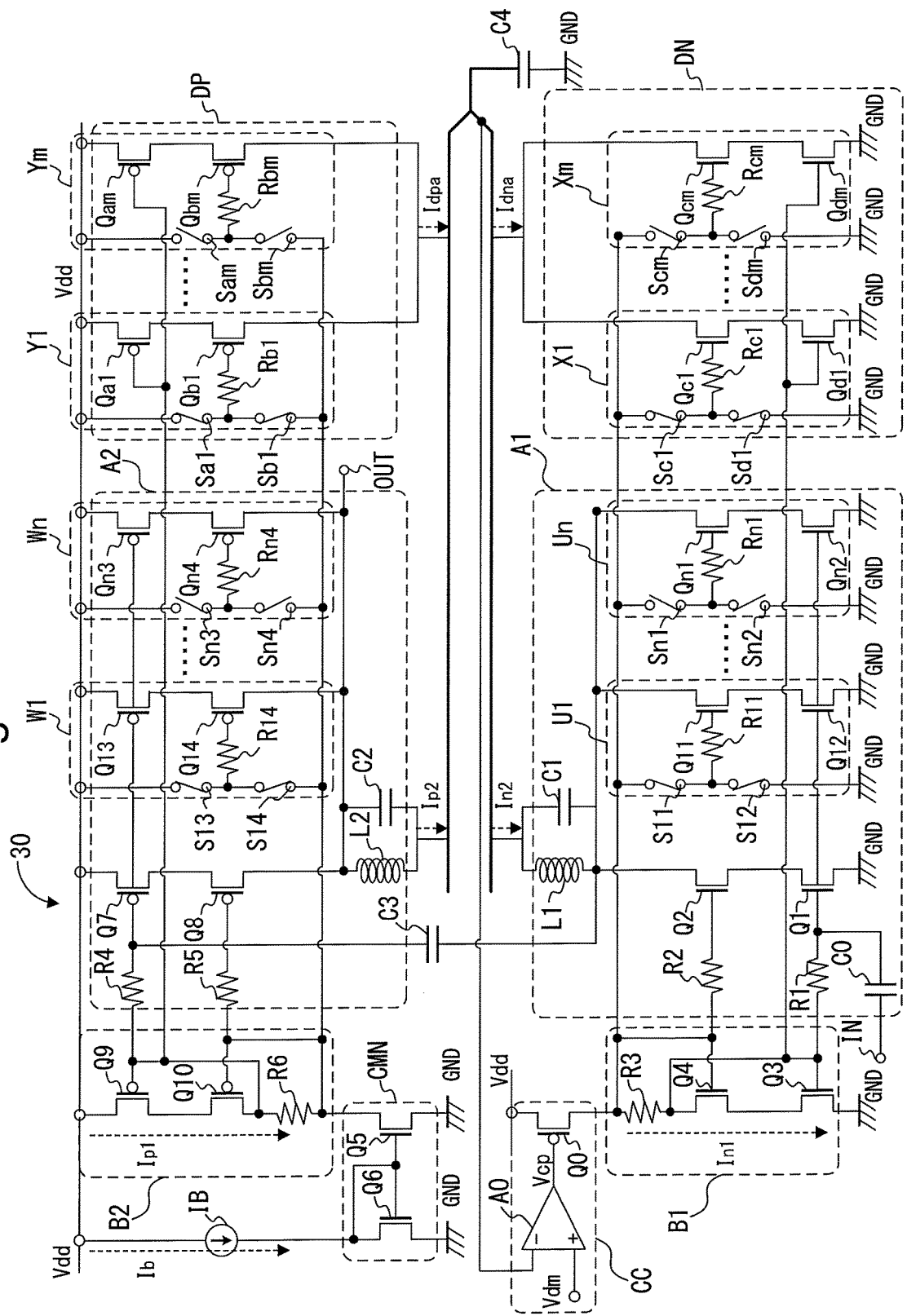
FIG. 11 is a circuit diagram illustrating, in detail, a core portion and current adjustment units in the circuit diagram of FIG. 10.

Alternatively, a plurality of cascode-connected transistor pairs may be connected in parallel to one another in each of the first amplification unit A1, the second amplification unit A2, the current adjustment unit DN, and the current adjustment unit DP in the configuration in which the current control unit CC is provided in the first stage and the current source IB and the current mirror circuit CMN are provided in the second stage as shown in FIG. 11. Also in such a configuration, each of the first amplification unit A1 and the second amplification unit A2 is configured such that the plurality of cascode-connected transistor pairs are connected in parallel to one another and whether to operate each transistor pair can be changed over by means of switching. Thus, the gain of the first amplification unit A1 and the gain of the second amplification unit A2 are variable. Therefore, small signal gains can be designed with a high degree of flexibility.

Also in the high-frequency amplifier circuit 30 shown in FIG. 11, each of the current adjustment unit DN in the first stage and the current adjustment unit DP in the second stage is configured such that the plurality of cascode-connected transistor pairs are connected in parallel to one another and whether to operate each transistor pair can be changed over by means of switching. Thus, adjustment current values are variable. Therefore, the difference between the current In2 flowing through the first amplification unit A1 and the current Ip2 flowing through the second amplification unit A2 can be appropriately adjusted as the situation demands.

As described above, the high-frequency amplifier circuit of the present invention is configured such that the first amplification unit in which two transistors are connected in cascode and the second amplification unit in which two transistors are connected in cascode are connected to each other in cascode. Thus, parasitic capacitance in the path from the output terminal to the input terminal is small. Therefore, the characteristic of blocking a signal flowing from the output terminal toward the input terminal, i.e., the reverse isolation characteristic, is high.

Moreover, in the high-frequency amplifier circuit of the present invention, the first amplification unit and the first bias unit are configured by the NMOS transistors of the first conductivity type, whereas the second amplification unit and the second bias unit are configured by the PMOS transistors of the second conductivity type. The first amplification unit is supplied with the ground potential and the intermediate potential, and the second amplification unit is supplied with the power-supply potential and the intermediate potential. The first bias unit and the second bias unit, on the other hand, are connected to the different current paths in each of which the power-supply potential and the ground potential are supplied to the opposite ends thereof to generate bias voltages and operate the first amplification unit and the second amplification unit, respectively.

Thus, whereas the amount of voltage drop due to the cascode connection of the first amplification unit and the second amplification unit is an amount corresponding to the four stages of the MOS transistors, the power-supply potential only needs to have a value equal to the amount of voltage drop for the three stages of the MOS transistors. Thus, as compared with the conventional high-frequency amplifier circuit that requires the power-supply potential corresponding to the amount of voltage drop for the four stages of the MOS transistors, the power-supply potential can be set to a lower value. Thus, the current flowing through the second amplification unit can be reused in the first amplification unit and the power-supply potential can be lowered. As a result, the power consumption can be significantly reduced.

Note that the embodiments of the present invention are not limited to the above-described embodiments. For example, in the above-described embodiment, each of the first amplification unit A1, the second amplification unit A2, the first bias unit B1, the second bias unit B2, the current adjustment unit DN in the first stage, and the current adjustment unit DP in the second stage has two cascode-connected transistors (transistor pair). However, the number of transistors included in each unit is not limited thereto. For example, each unit may include a transistor group in which three or more transistors, for example, are connected to one another in cascode. Alternatively, one of the first amplification unit A1 and the second amplification unit A2 may be configured by a single transistor.

Although the first conductivity type is the N type and the second conductivity type is the P type, which is the conductivity type opposite to the first conductivity type (N type), in the above-described embodiments, the present invention is not limited thereto. For example, a high-frequency amplifier circuit may be configured by setting the P type as the first conductivity type and the N type as the second conductivity type and by supplying the power-supply potential and the intermediate potential to the first amplification unit and supplying the intermediate potential and the ground potential to the second amplification unit. More specifically, the first amplification unit A1 and the first bias unit B1 may be configured by PMOS transistors and the second amplification unit A2 and the second bias unit B2 may be configured by NMOS transistors. The power-supply potential Vdd and the intermediate potential Vdm may be supplied to the first amplification unit A1, and the intermediate potential Vdm and the ground potential may be supplied to the second amplification unit A2.

This application is based on Japanese Application No. 2014-174235, which is incorporated herein by reference.

What is claimed is:

1. A high-frequency amplifier circuit for amplifying an input high-frequency signal and outputting the amplified high-frequency signal, comprising:
   a first amplification unit which receives a high-frequency signal via its input terminal and amplifies said high-frequency signal so as to generate an high-frequency amplified signal;
   a second amplification unit which further amplifies said high-frequency amplified signal to generate an output signal and outputs said output signal via its output terminal;
   a first bias unit which supplies a bias voltage to said first amplification unit in response to a first operating current applied thereto;
   a second bias unit which supplies a bias voltage to said second amplification unit in response to a second operating current applied thereto;
   an intermediate potential line which supplies an intermediate potential between a first potential and a second potential to said first amplification unit and said second amplification unit;
   a current generating unit which generates said first operating current; and
   a current control unit which is connected to said intermediate potential line and which controls said second operating current on the basis of said intermediate potential, wherein said first amplification unit includes:
   a first field effect transistor (FET) of a first conductivity type, having a source terminal supplied with said first potential; and
   a first inductor connected to said intermediate potential line, and said second amplification unit includes:
   a second FET of a second conductivity type opposite to said first conductivity type, having a source terminal supplied with said second potential; and
   a second inductor connected to said intermediate potential line.

2. The high-frequency amplifier circuit according to claim 1, wherein said first amplification unit includes a pair of series-connected FETs of said first conductivity type, and a first capacitor connected in parallel to said first inductor to constitute a first parallel resonant circuit together with said first inductor, and said second amplification unit includes a pair of series-connected FETs of said second conductivity type, and a second capacitor connected in parallel to said second inductor to constitute a second parallel resonant circuit together with said second inductor.

3. The high-frequency amplifier circuit according to claim 1, wherein said first bias unit includes a FET of said first conductivity type, having a source terminal supplied with said first potential, and said second bias unit includes a FET of said second conductivity type, having a source terminal supplied with said second potential.

4. The high-frequency amplifier circuit according to claim 1, wherein said current control unit includes an operational amplifier having an inverting input terminal connected to said intermediate potential line and a non-inverting input terminal applied with a direct-current voltage, and controls said operating current for said second bias unit in accordance with a potential difference between said intermediate potential and said direct-current voltage.

5. The high-frequency amplifier circuit according to claim 1, further comprising a current adjustment unit connected to said intermediate potential line, for generating an adjustment current according to a current difference between a current flowing through said first amplification unit and a current flowing through said second amplification unit.

6. The high-frequency amplifier circuit according to claim 5, wherein said current adjustment unit includes a FET of said first conductivity type and generates said adjustment current so that a sum of said current flowing through said first amplification unit and said adjustment current is equal to said current flowing through said second amplification unit.

7. The high-frequency amplifier circuit according to claim 5, wherein said current adjustment unit includes a FET of said second conductivity type and generates said adjustment current so that a sum of said current flowing through said second amplification unit and said adjustment current is equal to said current flowing through said first amplification unit.

8. The high-frequency amplifier circuit according to claim 1, wherein said first amplification unit includes a first transistor group in which a plurality of transistor pairs, each constituted by a pair of series-connected FETs of said first conductivity type, are connected in parallel, and said second amplification unit includes a second transistor group in which a plurality of transistor pairs, each constituted by a pair of series-connected FETs of said second conductivity type, are connected in parallel.

9. The high-frequency amplifier circuit according to claim 1, wherein said first potential is a ground potential, said first conductivity type is N-type, said second potential is a power-supply potential, and said second conductivity type is P-type.

10. The high-frequency amplifier circuit according to claim 1, wherein said first potential is a power-supply potential, said first conductivity type is P-type, said second potential is a ground potential, and said second conductivity type is N-type.

11. A high-frequency amplifier circuit for amplifying an input high-frequency signal and outputting the amplified high-frequency signal, comprising:
    a first amplification unit which receives a high-frequency signal via its input terminal and amplifies said high-frequency signal so as to generate a high-frequency amplified signal;

a second amplification unit which further amplifies said high-frequency amplified signal to generate an output signal and outputs said output signal via its output terminal;
a first bias unit which supplies a bias voltage to said first amplification unit in response to a first operating current applied thereto;
a second bias unit which supplies a bias voltage to said second amplification unit in response to a second operating current applied thereto;
an intermediate potential line which supplies an intermediate potential between a first potential and a second potential to said first amplification unit and said second amplification unit;
a current control unit which is connected to said intermediate potential line and which controls said first operating current on the basis of said intermediate potential; and
a current generating unit which generates said second operating current, wherein said first amplification unit includes:
a first field effect transistor (FET) of a first conductivity type, having a source terminal supplied with said first potential; and
a first inductor connected to said intermediate potential line, and said second amplification unit includes:
a second FET of a second conductivity type opposite to said first conductivity type, having a source terminal supplied with said second potential; and
a second inductor connected to said intermediate potential line.

12. The high-frequency amplifier circuit according to claim 11, wherein said first amplification unit includes a pair of series-connected FETs of said first conductivity type, and a first capacitor connected in parallel to said first inductor to constitute a first parallel resonant circuit together with said first inductor, and said second amplification unit includes a pair of series-connected FETs of said second conductivity type, and a second capacitor connected in parallel to said second inductor to constitute a second parallel resonant circuit together with said second inductor.

13. The high-frequency amplifier circuit according to claim 11, wherein said first bias unit includes a FET of said first conductivity type, having a source terminal supplied with said first potential, and said second bias unit includes a FET of said second conductivity type, having a source terminal supplied with said second potential.

14. The high-frequency amplifier circuit according to claim 11, wherein said current control unit includes an operational amplifier having an inverting input terminal connected to said intermediate potential line and a non-inverting input terminal applied with a direct-current voltage, and controls said operating current for said first bias unit in accordance with a potential difference between said intermediate potential and said direct-current voltage.

15. The high-frequency amplifier circuit according to claim 11, further comprising a current adjustment unit connected to said intermediate potential line, for generating an adjustment current according to a current difference between a current flowing through said first amplification unit and a current flowing through said second amplification unit.

16. The high-frequency amplifier circuit according to claim 15, wherein said current adjustment unit includes a FET of said first conductivity type and generates said adjustment current so that a sum of said current flowing through said first amplification unit and said adjustment current is equal to said current flowing through said second amplification unit.

17. The high-frequency amplifier circuit according to claim 15, wherein said current adjustment unit includes a FET of said second conductivity type and generates said adjustment current so that a sum of said current flowing through said second amplification unit and said adjustment current is equal to said current flowing through said first amplification unit.

18. The high-frequency amplifier circuit according to claim 11, wherein said first amplification unit includes a first transistor group in which a plurality of transistor pairs, each constituted by a pair of series-connected FETs of said first conductivity type, are connected in parallel, and said second amplification unit includes a second transistor group in which a plurality of transistor pairs, each constituted by a pair of series-connected FETs of said second conductivity type, are connected in parallel.

19. The high-frequency amplifier circuit according to claim 11, wherein said first potential is a ground potential, said first conductivity type is N-type, said second potential is a power-supply potential, and said second conductivity type is P-type.

20. The high-frequency amplifier circuit according to claim 11, wherein said first potential is a power-supply potential, said first conductivity type is P-type, said second potential is a ground potential, and said second conductivity type is N-type.

* * * * *